United States Patent
Lue

(10) Patent No.: US 7,483,309 B2
(45) Date of Patent: Jan. 27, 2009

(54) PROGRAMMING AND ERASING METHOD FOR CHARGE-TRAPPING MEMORY DEVICES

(75) Inventor: Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/894,838

(22) Filed: Aug. 21, 2007

(65) Prior Publication Data

US 2007/0291548 A1 Dec. 20, 2007

Related U.S. Application Data

(63) Continuation of application No. 10/951,999, filed on Sep. 27, 2004, now Pat. No. 7,274,601.

(51) Int. Cl.
*G11C 16/04* (2006.01)

(52) U.S. Cl. .......................... 365/185.24; 365/185.28; 365/185.29

(58) Field of Classification Search ............. 365/185.24
See application file for complete search history.

(56) References Cited

U.S. PATENT DOCUMENTS

| | | | | |
|---|---|---|---|---|
| 5,598,368 A * | 1/1997 | Takahashi et al. | ...... | 365/185.01 |
| 6,556,481 B1 * | 4/2003 | Hsu et al. | ............. | 365/185.24 |
| 6,614,693 B1 * | 9/2003 | Peng et al. | ............. | 365/185.29 |
| 6,721,204 B1 | 4/2004 | Yeh et al. | | |
| 7,133,313 B2 * | 11/2006 | Shih | ....................... | 365/185.18 |
| 7,164,603 B2 * | 1/2007 | Shih et al. | ............. | 365/185.18 |
| 2001/0028576 A1 * | 10/2001 | Miwa et al. | ............. | 365/185.03 |

FOREIGN PATENT DOCUMENTS

CN     1484301 A     3/2004

OTHER PUBLICATIONS

English Abstract of CN1484301A.

* cited by examiner

*Primary Examiner*—Son L Mai
(74) *Attorney, Agent, or Firm*—Stout, Uxa, Buyan & Mullins, LLP

(57) ABSTRACT

A method for programming and erasing charge-trapping memory device is provided. The method includes applying a first negative voltage to a gate causing a dynamic balance state (RESET\ERASE state). Next, a positive voltage is applied to the gate to program the device. Then, a second negative voltage is applied to the gate to restore the device to the RESET\ERASE state.

12 Claims, 8 Drawing Sheets

PROGRAMMING AND ERASING METHOD FOR CHARGE-TRAPPING MEMORY DEVICES

CROSS REFERENCE TO RELATED APPLICATION

This application is a continuation of U.S. application Ser. No. 10/951,999, filed on Sep. 27, 2004 U.S. Pat. No. 7,274,601. The disclosure of this prior application from which priority is claimed is incorporated herein by reference.

BACKGROUND OF THE INVENTION

The present invention relates generally to memory devices and, more particularly, to a method for programming and erasing memory devices.

Memory devices for non-volatile storage of information are in widespread use today. Some of the non-volatile memory devices function based on charge trapping. Examples of such charge-trapping devices are silicon-oxide-nitride-oxide-semiconductor (SONOS), and nitrided read only memory (NROM). Charge-trapping devices generally include a charge-trapping layer sandwiched between two oxide layers. The charge is stored in the charge-trapping layer and the data is recorded using the stored charge. The erase method for charge-trapping devices is much more difficult than floating gate devices because the electrons reside in the deep level trap causing electron de-trapping to be very slow.

FIG. 1 shows a SONOS structure. The figure includes a substrate 10, a source 12, and a drain 14. The SONOS structure further includes an oxide-nitride-oxide (ONO) film layers 16, 18, and 20 respectively, between the substrate 10 and the gate 22. The nitride layer 18 is used for trapping charge. The charge is injected to or rejected from the nitride layer 18.

SONOS is generally programmed and erased by direct tunneling. Tunneling is a quantum mechanical process where charge carriers acquire sufficient energy to tunnel through an oxide layer and get trapped in the nitride layer. However, in conventional SONOS devices, a thin tunnel oxide layer of about 20Å is used to enhance the erase speed. In this type of structure, direct tunneling of holes is the major mechanism used for erasing. The direct tunneling of holes is used to compensate for the electrons. For SONOS, the erase state $V_T$ is negative due to this hole direct tunneling. But, the use of thin tunnel gate oxide suffers from poor retention properties due to charge leakages.

In order to prevent charge leakage NROMs have been used. Each of the NROM cell bits is programmed by channel hot electron injection. Channel hot electron injection involves applying a high voltage at the drain and the gate, which causes electrons to pass from the channel into the trapping layer. However, electrons cannot be removed from the trapped layer as the electrons are deeply embedded in the trapped layer. Therefore, the erase process involves hot-hole injection through the bottom oxide. The holes are generated by band-to-band tunneling, accelerated by a lateral field, and then injected through the bottom oxide to compensate for the electrons. However, hot hole injection requires a large junction bias and this is well-known to cause damage to the bottom oxide layer. The damage to the bottom layer is likely the cause of reliability problems such as high $V_T$ charge loss, low $V_T$ charge gain and read disturb.

In light of the foregoing, there is a need for a reliable and structured, programming and erasing method for charge-trapping memory devices.

SUMMARY OF THE INVENTION

Broadly speaking, the present invention enables programming and erasing in charge-trapping memory devices. The method and the structure defined herein improves charge retention and reliability of the charge-trapping memory devices.

In accordance with one aspect of the present invention, a method for programming and erasing charge-trapping memory devices is provided. The method comprises applying a first negative voltage to a gate for a fresh sample. This process is called RESET of the device. The RESET causes a dynamic balance between the gate injection and the de-trapping of electrons. Next, a positive voltage is applied to the gate causing additional electrons to be injected from the channel to the trapping layer. For the erase operation, a negative gate voltage is applied to restore the device to the reset/erase state.

In accordance with another aspect of the present invention, a charge-trapping memory device is provided. The memory device includes a bottom oxide layer, a trapping layer, and a top oxide layer. The poly gate is preferably made of P$^+$ poly material in order to reduce the gate injection. Other high-work function metal gate can also be adopted to reduce the gate injection.

The advantages of the present invention are numerous. First, the invention is reliable. Second, the power consumption is low. Third, the device is suitable for shrinkage and provides improved scalability. Fourth, the erase mechanism is self converging and therefore, has no over erasing issues. Fifth, the device is free of plasma-charging effects.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and, together with the description, serve to explain the principles of the invention.

DETAILED DESCRIPTION OF EXEMPLARY EMBODIMENTS

Reference is made in detail to embodiments of the invention. While the invention is described in conjunction with the embodiments, the invention is intended to cover alternatives, modifications, and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
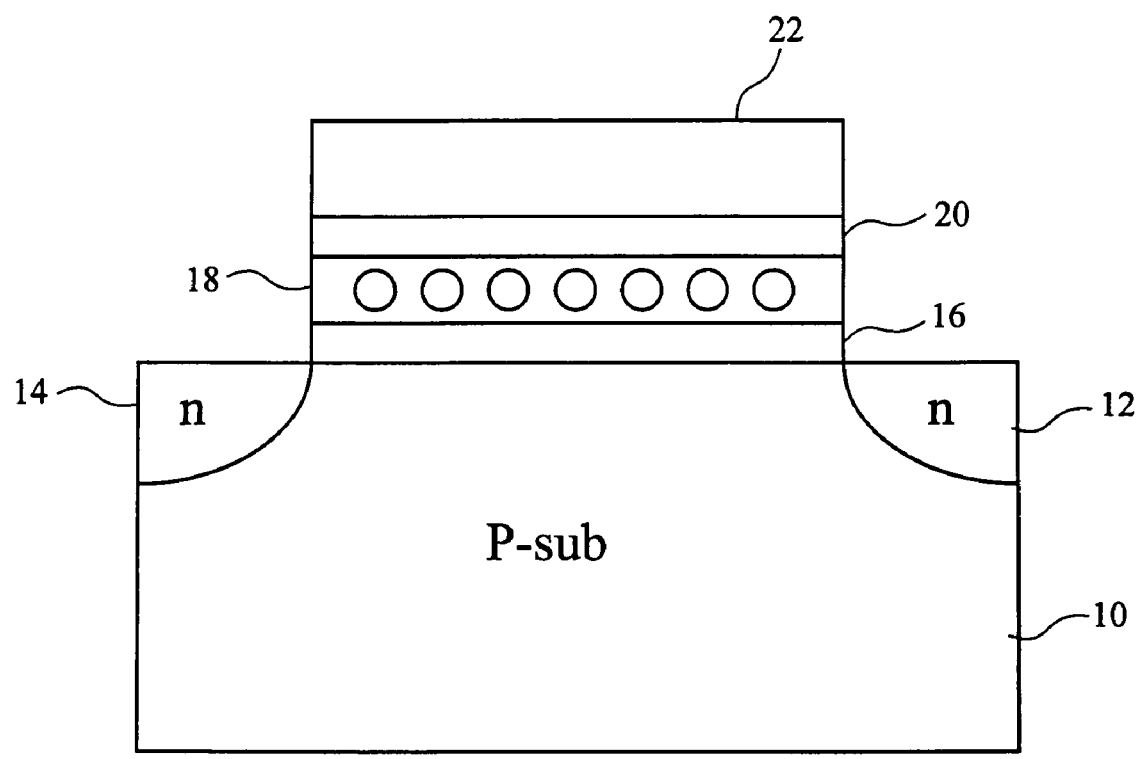
FIG. 1 shows a typical semiconductor-oxide-nitride-oxide-semiconductor (SONOS) device.
Figure 2A:
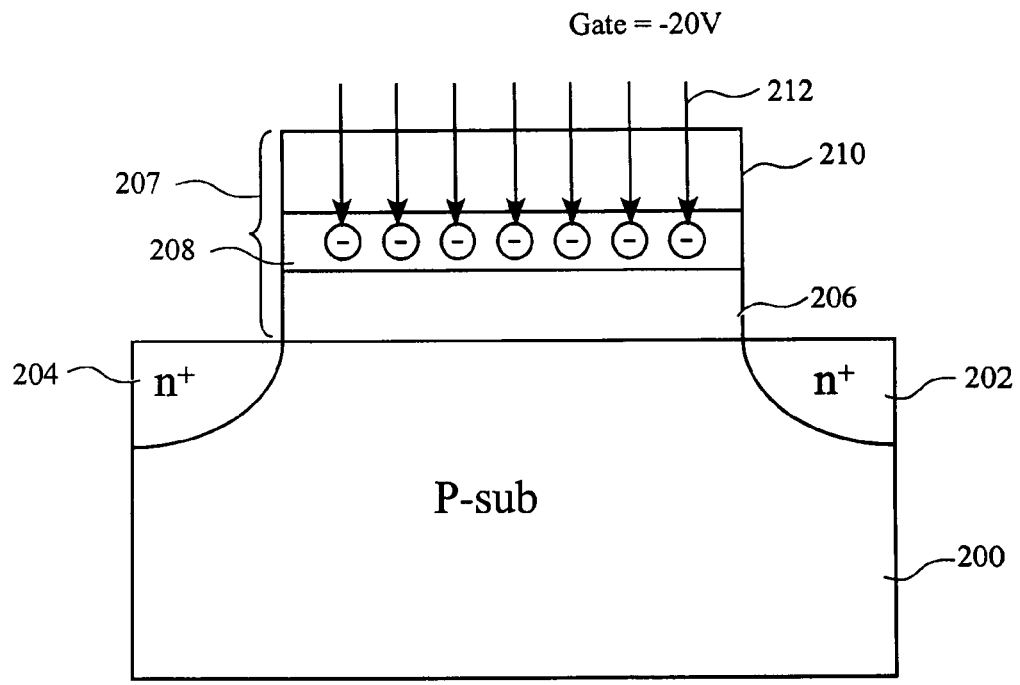
FIG. 2A illustrates resetting the device by applying a negative voltage to the gate of the device in accordance with an embodiment of the invention.
Figure 2B:
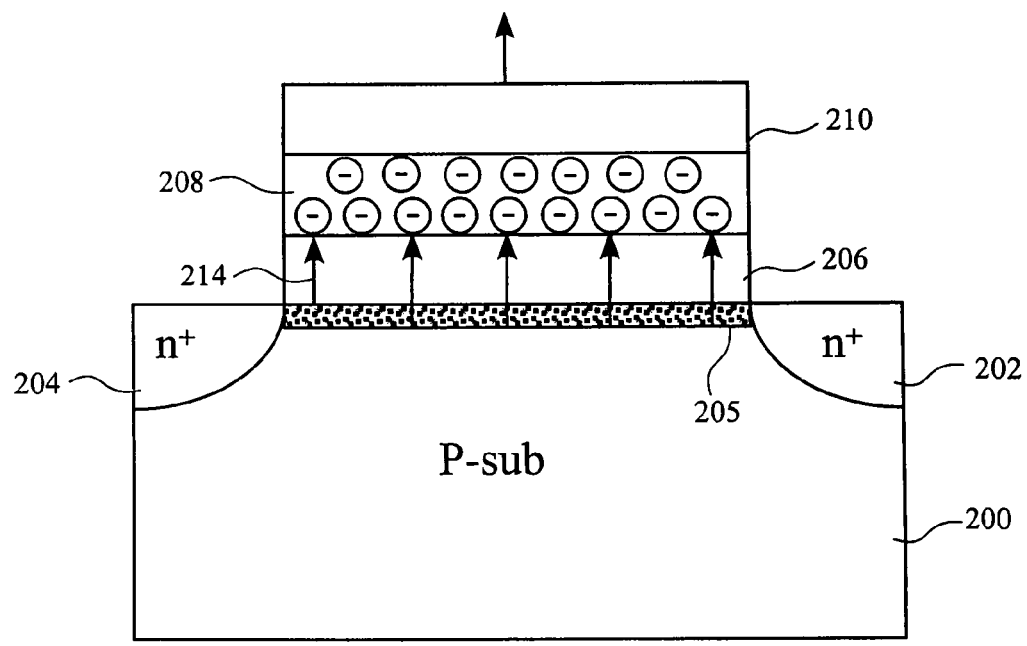
FIG. 2B illustrates programming the device by applying a positive voltage to the gate of the device in accordance with an embodiment of the invention.
Figure 2C:
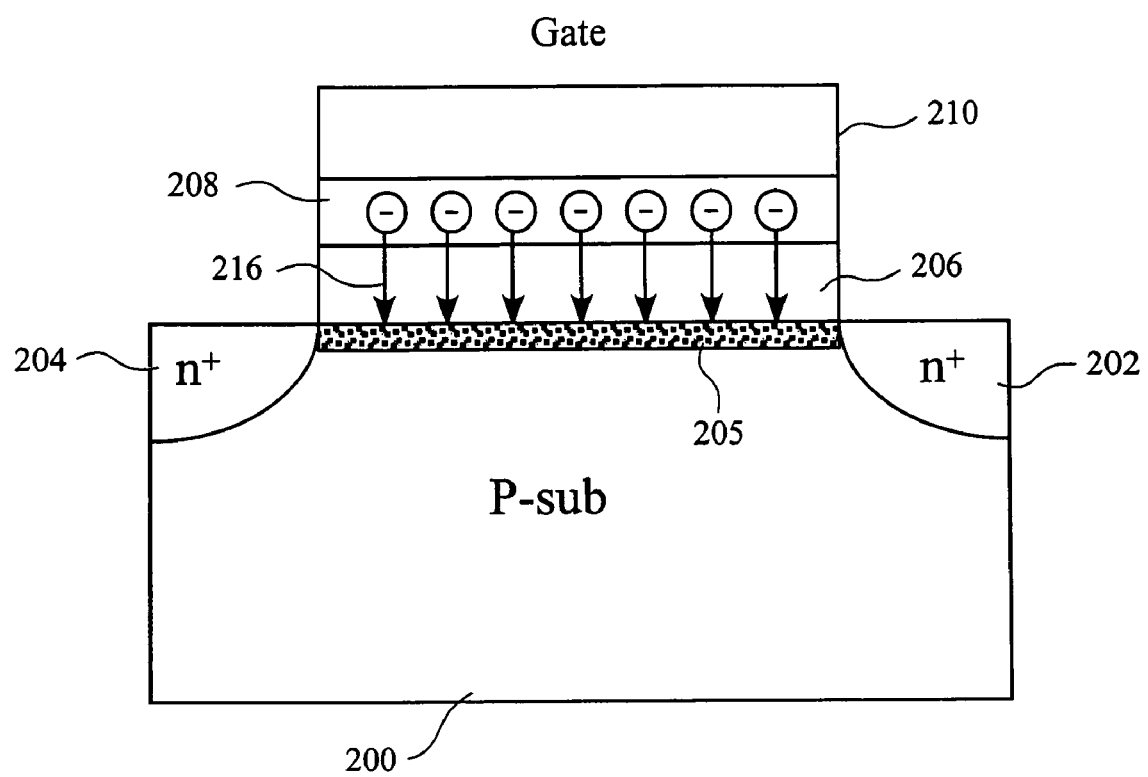
FIG. 2C illustrates erasing the device by applying a negative voltage to the gate in accordance with an embodiment of the invention.

The present invention provides a method for programming and erasing charge-trapped devices. The memory device includes an oxide-nitride-oxide structure. An embodiment of the invention is illustrated in FIGS. 2A-2C. FIG. 2A illustrates a cross-sectional view of a charge-trapped memory device. FIG. 2A includes a P-silicon substrate 200. The silicon substrate has two doped junctions 202 and 204. Disposed over the substrate 200 is an oxide-nitride-oxide (ONO) structure 207. The ONO structure 207 includes bottom and top oxide layers 206 and 210, respectively. A nitride layer 208 is disposed between the top and bottom oxide layers 206 and 210. A gate (not shown) is defined over the top oxide layer 210. In FIG. 2A, the device is firstly reset through Fowler-Nordheim (-FN) gate injection as illustrated by arrows 212. Fowler-Nordham gate injection is accomplished by applying a negative voltage to the gate. The negative voltage to the gate places the device in a reset/erase state. The reset/erase state is the dynamic balance state of the gate injection and the charge de-trapping mechanisms. The applied negative voltage is in the range of about -15V to about -23V.

Programming can be carried out by applying a positive gate voltage as shown in FIG. 2B. Application of a positive voltage in the range of about 20V causes the device to inject electrons from the n-inversion channel 205 to the trapping layer 208 as indicated by arrows 214. A negative voltage is applied to the gate in order to restore the device from the programmed state to the reset\erased state. In one embodiment, the applied negative voltage is the same as the amount of voltage applied in FIG. 2A for resetting. The erase process is illustrated in FIG. 2C. When a negative voltage is applied to the gate, additional injected electrons during the programming operation, as shown in FIG. 2B, may be propelled out of the trapping layer in the erase cycle as indicated by the arrows 216 in FIG. 2C.

In one embodiment of the invention, the gate is made of material having a large effective barrier height to reduce the gate injection. Gates with P$^+$ poly gate or metal gate with a high work function is preferred over N$^+$ polygate, as this will reduce the threshold voltage ($V_T$) of the RESET state. Moreover, -FN erasing is possible with the use of P$^+$ poly gate material. The P$^+$ poly gate material effectively reduces the gate injection, allowing the gate to be operated under a large negative gate voltage $V_G$. In one embodiment, the P+-poly gate may be fabricated by depositing an un-doped poly silicon film, followed by implanting Boron or BF2 into the poly silicon film. The large negative gate voltage enhances the electron de-trapping. Also, with the use of a large $V_G$, thick tunnel oxides may be used. Use of thick tunnel oxide helps to prevent charge leakage and this makes the device more reliable. In one embodiment, a tunnel oxide layer having a thickness ranging from 3 nm to 6 nm is used.

Although a small amount of gate injection still occurs, the erasing operation acts as a dynamic balance between the gate injection and the electron trapping. As illustrated in FIG. 2C, the negative voltage applied during the erase operation repels the additional electrons and restores the device to the balance state. The erase operation described above is self-converging.

Figures 3A, 3B, 3C:
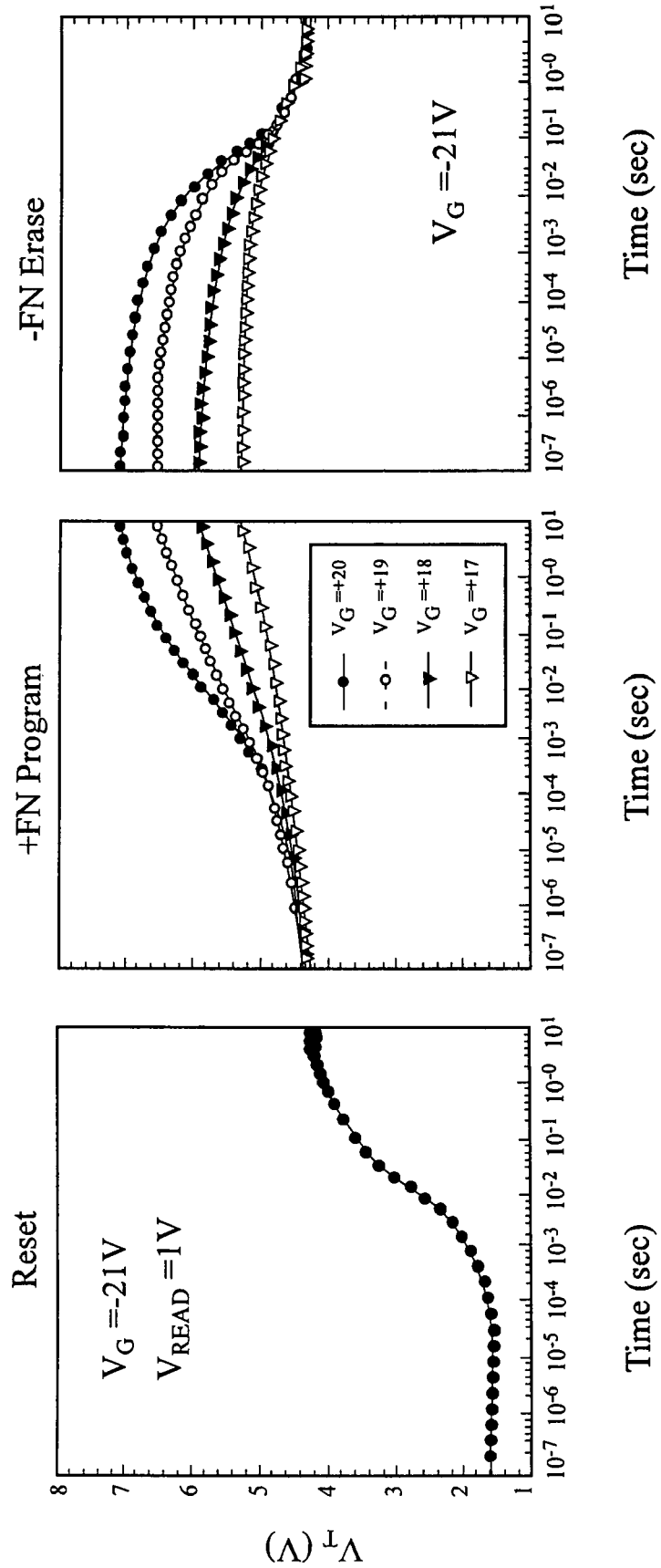
FIG. 3A is a graph of the RESET state characteristics of the device, in accordance with an embodiment of the invention.
FIG. 3B is a graph of the program state characteristics of the device, in accordance with an embodiment of the invention.
FIG. 3C is a graph of the erase state characteristics of the device, in accordance with an embodiment of the invention.

FIGS. 3a to 3c illustrate the experimental result of the memory operation in accordance with an embodiment of the invention. The result is for a device that is fabricated by NROM technology with 0.25 m design rule. The poly gate is Boron doped P$^+$ poly gate to reduce the gate injection. The thickness of the bottom oxide, nitride trapping layer and top blocking oxide are 5.5, 6, and 9 nm, respectively. FIG. 3a is a graph illustrating the RESET state of the device in accordance with an embodiment of the invention. The threshold voltage $V_T$ is shown on the y-axis and the time in seconds is shown on the x-axis. For resetting the device, a gate voltage of about -21 V and a read voltage of about 1V is applied. The resetting operation proceeds as described above.

Subsequent to resetting, the device can be programmed. FIG. 3b is a graph illustrating the program state of the device in accordance with an embodiment of the invention. In FIG. 3b, the threshold voltage $V_T$ is plotted on the y-axis and the time in seconds is plotted on the x-axis. Each of the lines illustrated by the different shapes, represent a different gate voltage. The gate voltage range from about 17V to about 20V.

FIG. 3c is a graph illustrating the erase state in accordance with an embodiment of the invention. Like FIGS. 3a and 3b, the threshold voltage $V_T$ is shown on the y-axis and the time in seconds is shown on the x-axis. To erase the device, the same negative gate voltage as the RESET operation can be applied to restore the device to the original RESET\ERASE state. The reason is because a dynamic balance state happens when the gate voltage is about -21 V. Under this gate voltage, only certain $V_T$ state can be kept stable in order to keep the gate injection and electron-de-trapping balance each other. In this way, the additional injected electrons by a positive gate voltage can be propelled out of nitride. The erase operation described above is self-convergent. As such, the present invention eliminates the issues associated with over-erase.

Figure 4:
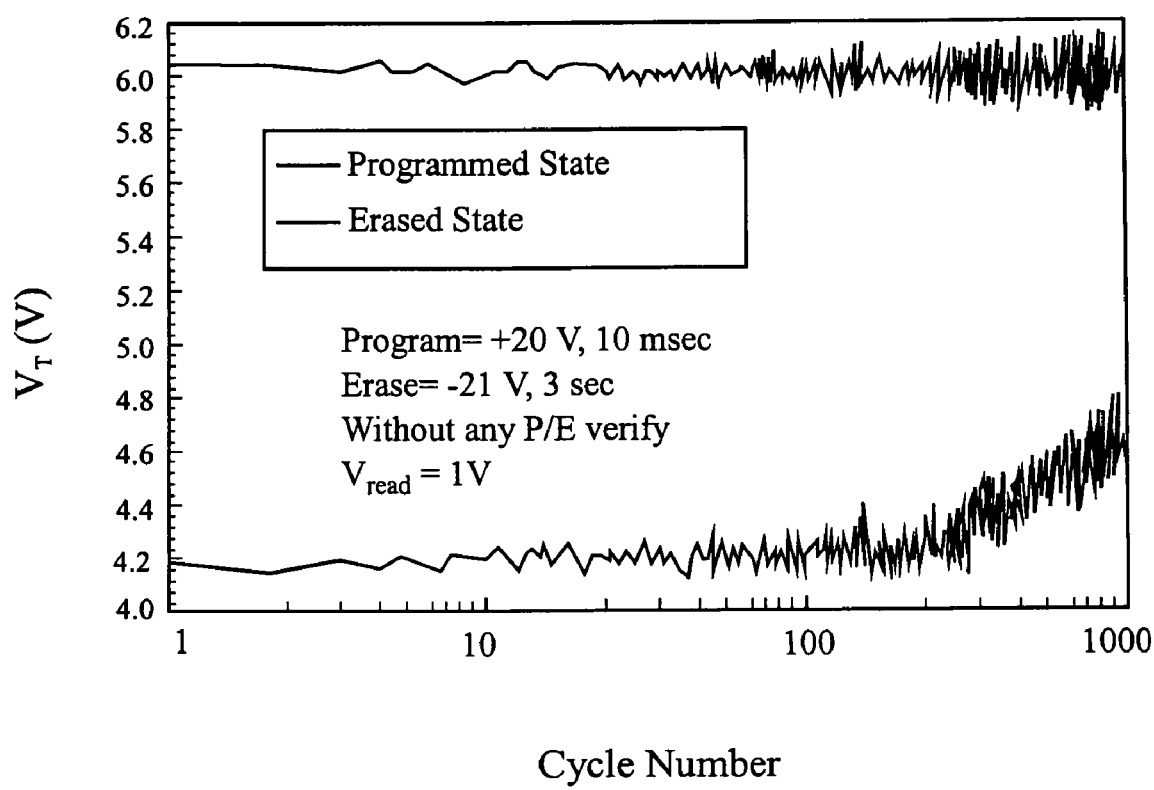
FIG. 4 is a graph illustrating the endurance properties of the device in accordance with an embodiment of the invention.
Figure 5:
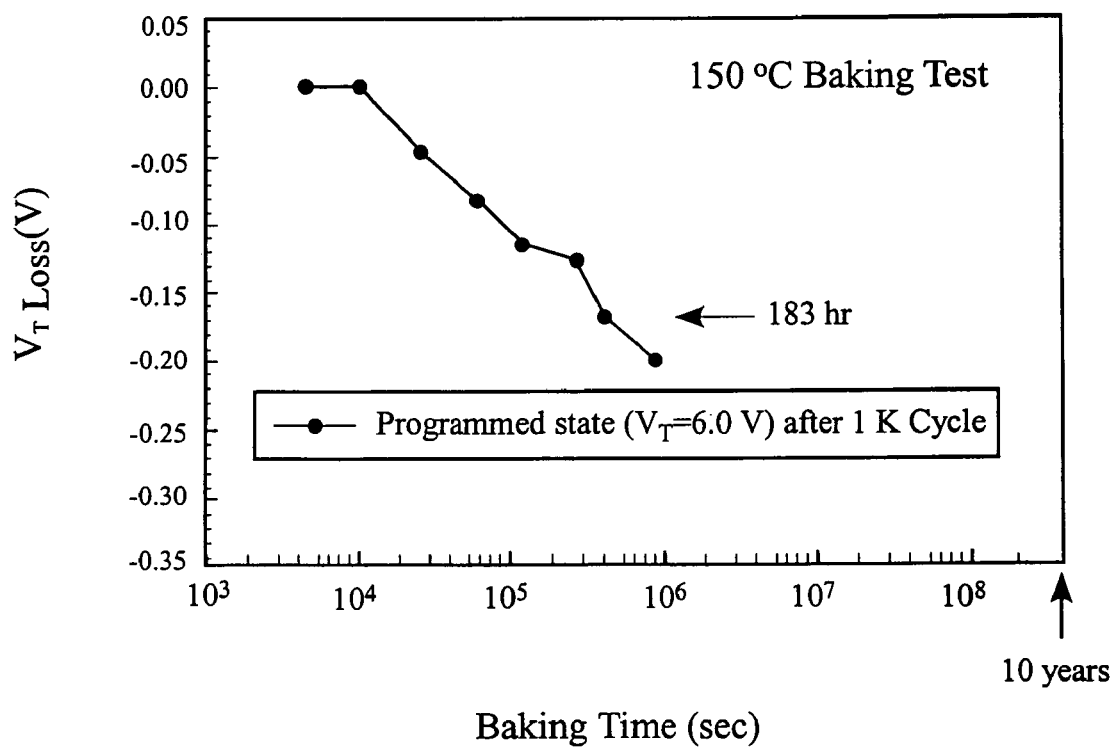
FIG. 5 is a graph that shows the charge retention capability for 1K program/erase cycles in a high temperature baking environment in accordance with an embodiment of the invention.

FIG. 4 is a graph illustrating the endurance properties of the operation in accordance with an embodiment of the invention. The $V_T$ is shown on the y-axis and the number of cycles is shown on the x-axis. The programming as described above, is accomplished by applying a voltage in the range of about 20V. The erase operation is accomplished by applying a voltage of about -21V as described above with respect to FIG. 3C. As can be seen, the present invention provides high charge retention due to the thick bottom oxide used. The thick bottom oxide also helps to avoid hot-hole injection, which further helps to retain the charge. FIG. 5 is a graph that shows the charge loss for 1K program/erase cycles in high temperature baking environment in accordance with an embodiment of the invention. The $V_T$ loss is shown on the y-axis and the baking time in years is shown on the x-axis. Even here the charge loss is small.

Figure 6:
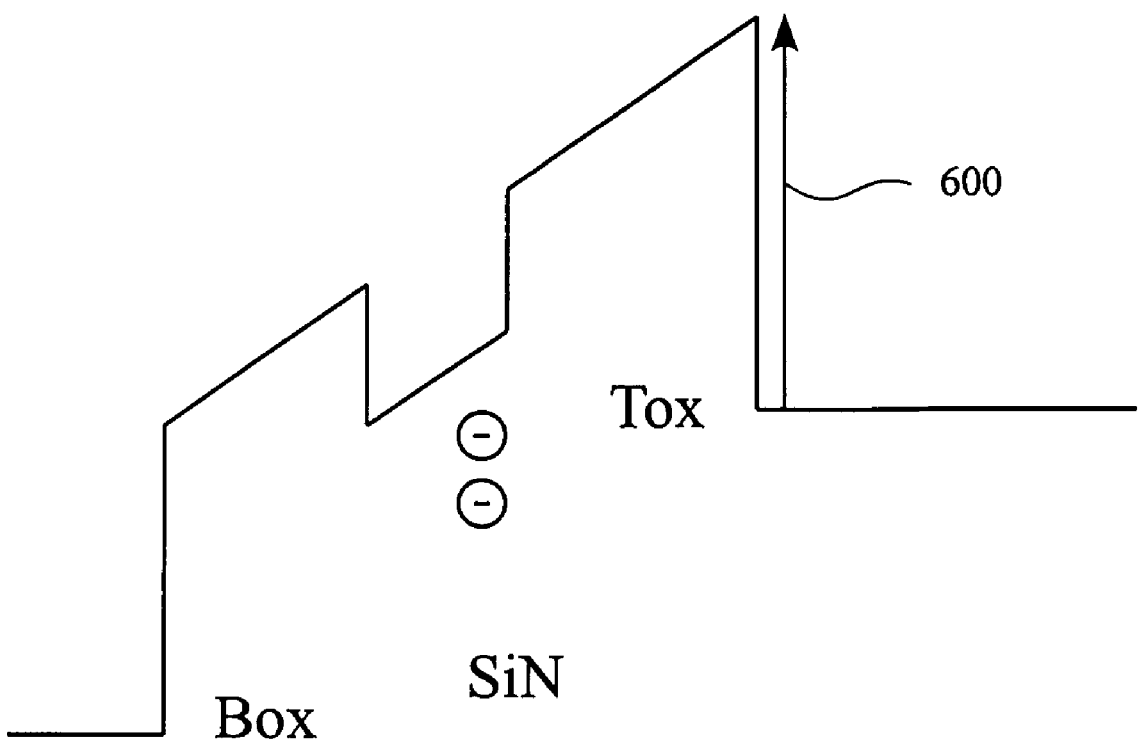
FIG. 6 shows the barrier height required for gate injection in accordance with an embodiment of the invention.

Referring to FIG. 6, the Figure illustrates barrier height 600 required for gate injection in accordance with an embodiment of the present invention. The barrier height is generally maintained high in order to reduce the gate injection and threshold reset voltage. In one embodiment, the barrier height is larger than that of oxide and silicon conduction band offset, of about 3.1 eV. In case of a heavily doped P+-poly gate, the barrier height should be close to the band offset between the oxide and silicon valence band, namely, 4.2 eV. This way, the Fowler-Nordham tunneling from the poly gate can be greatly reduced, and the RESET\ERASE state $V_T$ can be lowered.

Figure 7:
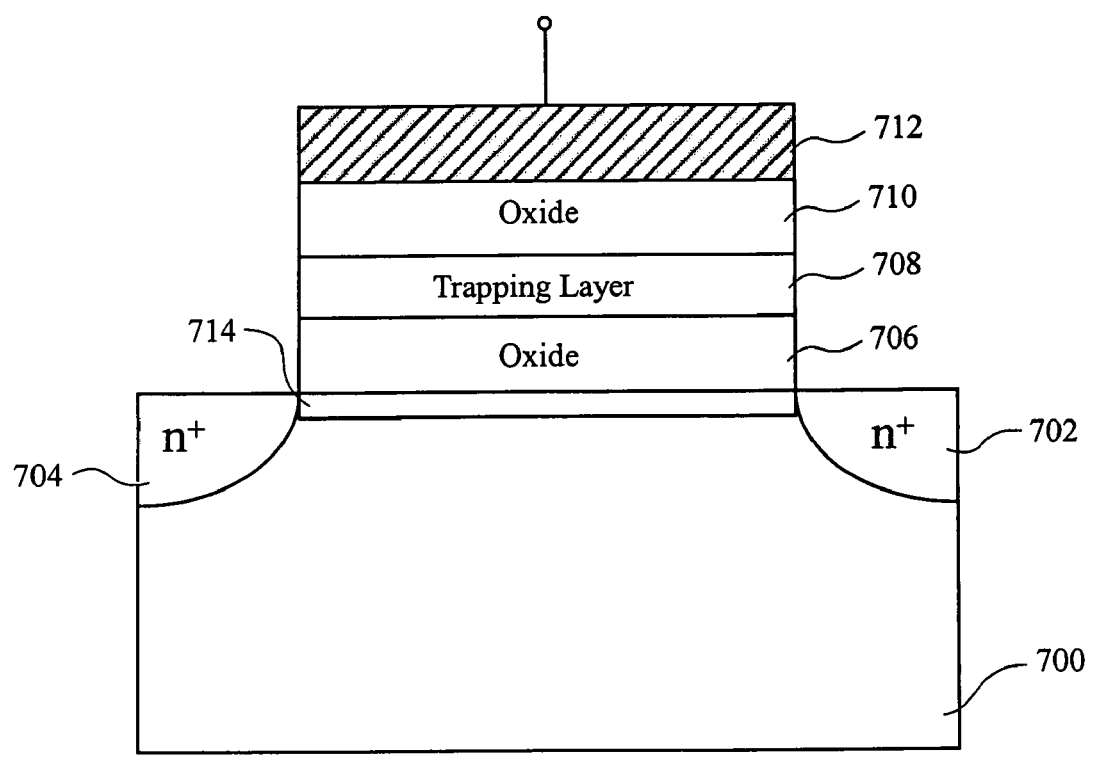
FIG. 7 shows a across sectional view of a charge-trapped memory device in accordance with an embodiment of the invention.

FIG. 7 shows a cross sectional view of a charge-trapping memory device in accordance with an embodiment of the invention. The memory device includes a p-substrate 700 and source and drain junctions 702 and 704. The memory device further includes a top oxide layer 710 and bottom oxide layer 706. A trapping layer 708 is disposed between two oxide layers 706 and 710. A gate 712 is disposed over the top oxide layer 710. When a voltage is applied to the gate 712, a channel 714 is formed under the oxide layer 706 between the drain 702 and source 704.

Applying a negative voltage to the gate 712 may reset the charged memory device described in FIG. 7. The negative voltage effectively resets the device. In one embodiment of the present invention, Fowler-Nordham tunneling is used to program and erase the memory device. Fowler-Nordheim tunneling is accomplished by applying a powerful electric field across the oxide layer, which enables electrons to tunnel through the oxide.

In the charge-trapped memory device described in FIG. 7, the gate may be of the type P+ poly gate so the gate injection may be reduced. The gate may also be made of metals with large work functions, such as platinum. In order to enhance the de-trapping of electrons and the erase speed, the thickness of the bottom oxide layer may be adjusted. Also, the property parameters of the individual layers that make up the ONO stack may be adjusted. For example, materials with high dielectric constant (k), such as $Al_2O_3$ or $HF_2O_3$, may be used in place of conventional nitride-trapping layers so that the de-trapping rate may be varied. As such, the erase characteristics of the device in the present invention will differ from that of conventional charge-trapping devices, as the trap state energy spectrum will be different from that of a nitride layer. This also helps to alter the erase speed.

High-k tunnel oxide is likely to decrease the barrier height required for detrapping and tunneling. Consequently, the detrapping and the erase speed may be increased. Also, the use of a high-k material for the bottom oxide layer is likely to decrease the top oxide electric field, which is also likely to result in reduced gate injection. In one embodiment, the high-k material that may be used to replace the top oxide preferably have a dielectric constant of about 9, and a barrier height for gate injection greater than about 3 eV, in order to reduce the gate injection.

The invention has been described thus far in terms of several exemplary embodiments. Other embodiments of the invention will be apparent to those skilled in the art from consideration of the specifications and practice of the invention. The embodiments and preferred features described above should be considered exemplary, with the scope of the invention being defined by the appended claims and their equivalents.

What is claimed is:

1. A method for operating a memory cell having an insulator layer, a tunnel layer, and a trapping layer in between, comprising:
    applying a first voltage to change a threshold voltage to a first state; and
    applying a second voltage to alter the threshold voltage to a second state, wherein a reset voltage is applied to the memory cell to bring the threshold voltage of the memory cell to a predetermined level prior to the application of the first and second voltages.

2. A method as recited in claim 1, wherein applying the reset voltage is a negative voltage.

3. A method as recited in claim 2, wherein applying the reset voltage to a gate is in the range from about −15V to about −23V.

4. A method as recited in claim 2, wherein applying the reset voltage to a gate causing electron detrapping.

5. A method as recited in claim 4, wherein the memory cell is operated by Fowler-Nordheim (FN) method.

6. A method as recited in claim 1, wherein applying the first voltage is a positive voltage.

7. A method for operating a memory cell having an insulator layer, a tunnel layer, and a trapping layer in between, comprising:
    applying a first voltage to change a threshold voltage to a first state, the first voltage being applied to a gate in the range from about 14 to about 20V; and
    applying a second voltage to alter the threshold voltage to a second state, wherein a reset voltage is applied to the memory cell to bring the threshold voltage of the memory cell to a predetermined level prior to the application of the first and second voltages.

8. A method as recited in claim 6, wherein applying the first voltage to a gate causing electron tunneling to the trapping layer.

9. A method as recited in claim 8, wherein the memory cell is operated by Fowler-Nordheim (FN) method.

10. A method as recited in claim 1, wherein applying the second voltage is a negative voltage.

11. A method as recited in claim 10, wherein applying the second voltage to a gate causing repelling electron from the trapping layer.

12. A method as recited in claim 11, wherein the memory cell is operated by Fowler-Nordheim (FN) method.

* * * * *